United States Patent
Numaguchi et al.

(10) Patent No.: US 7,995,128 B2
(45) Date of Patent: Aug. 9, 2011

(54) CHARGE-COUPLED APPARATUS AND DEVICE INCORPORATING A TRANSFER PULSE SUPPLYING CIRCUIT FOR DRIVING A VERTICAL TRANSFER UNIT

(75) Inventors: Shogo Numaguchi, Fukuoka (JP); Hiroaki Tanaka, Fukuoka (JP); Isao Hirota, Kanagawa (JP); Norihiko Yoshimura, Fukuoka (JP)

(73) Assignee: Sony Corporation, Tokyo (JP)

(*) Notice: Subject to any disclaimer, the term of this patent is extended or adjusted under 35 U.S.C. 154(b) by 641 days.

(21) Appl. No.: 12/108,152

(22) Filed: Apr. 23, 2008

(65) Prior Publication Data
US 2008/0266436 A1    Oct. 30, 2008

(30) Foreign Application Priority Data

Apr. 24, 2007 (JP) ................................. 2007-114864

(51) Int. Cl.
*H04N 3/14* (2006.01)
*H04N 5/335* (2011.01)
*H01L 31/062* (2006.01)
*H01L 31/113* (2006.01)

(52) U.S. Cl. ........................ 348/312; 348/317; 257/291
(58) Field of Classification Search .......... 348/302–304, 348/311–324; 257/290, 293–294
See application file for complete search history.

(56) References Cited

U.S. PATENT DOCUMENTS

| | | | |
|---|---|---|---|
| 2006/0022235 A1* | 2/2006 | Kanbe | 257/294 |
| 2006/0270092 A1* | 11/2006 | Nichols et al. | 438/57 |
| 2006/0285000 A1* | 12/2006 | Mabuchi | 348/308 |
| 2007/0064138 A1* | 3/2007 | Wada | 348/311 |
| 2008/0315185 A1* | 12/2008 | Araki | 257/40 |

FOREIGN PATENT DOCUMENTS

| | | |
|---|---|---|
| JP | 2000-138943 | 5/2000 |
| JP | 2005-269060 | 9/2005 |

* cited by examiner

*Primary Examiner* — Kelly L Jerabek
(74) *Attorney, Agent, or Firm* — SNR Denton US LLP

(57) ABSTRACT

A transfer pulse supplying circuit for supplying transfer pulses to a solid-state imaging apparatus including a charge transfer unit includes N (N is an integer of two or more) transfer pulse supplying wirings to which the transfer pulses are supplied, and lead-in wirings connecting the transfer pulse supplying wirings to corresponding lead-out wirings from the charge transfer unit. The respective lead-in wirings have almost the same width and length as one another. At least part of the lead-in wirings is divided into a first region and a second region by slits, and the first region is connected to the transfer pulse supplying wirings and the lead-out wiring, the second region is connected to the lead-out wiring. Regions of the respective lead-in wirings connected to the transfer pulse supplying wirings have almost the same ratio of width to length as one another.

7 Claims, 7 Drawing Sheets

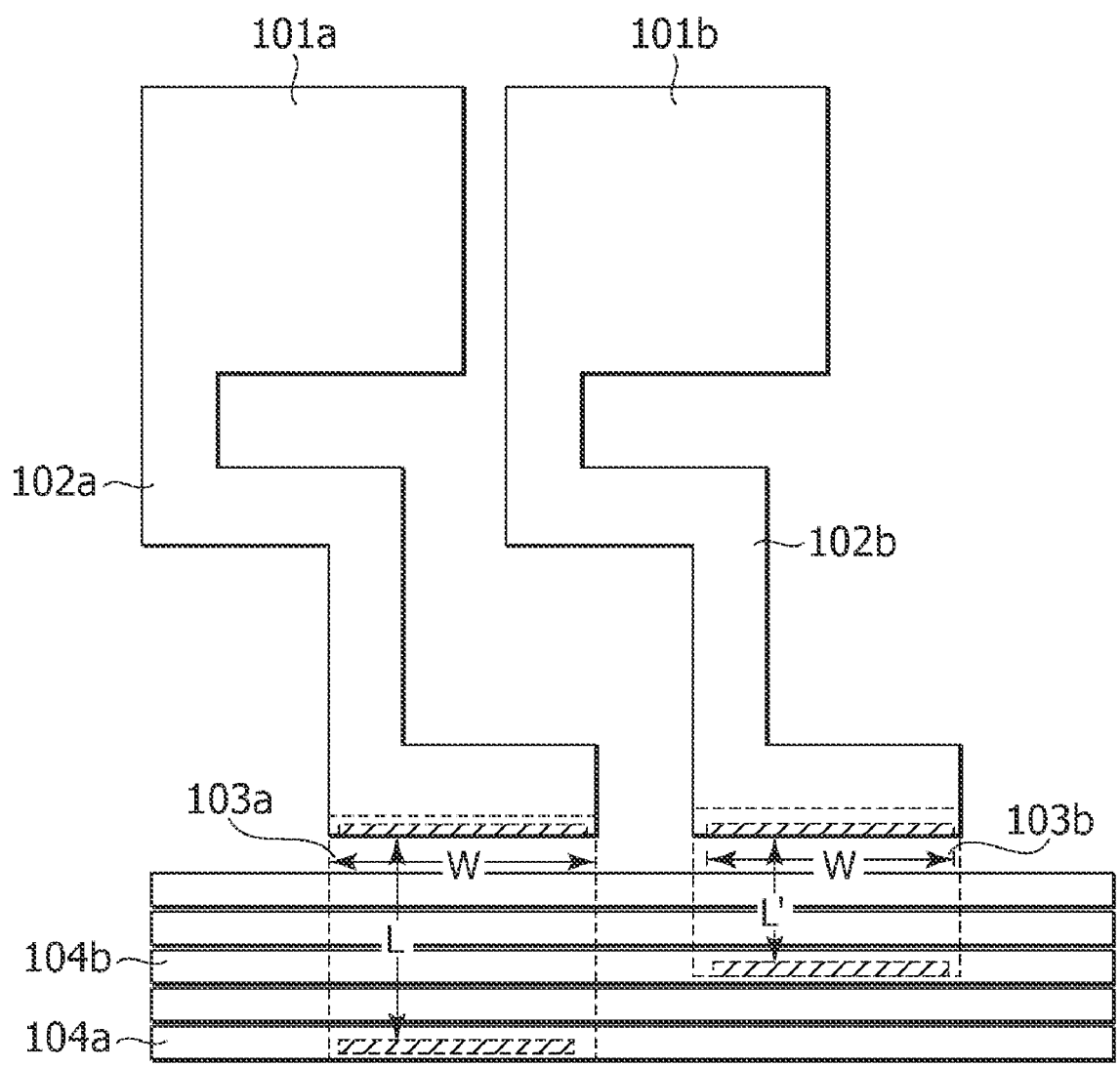

CHARGE-COUPLED APPARATUS AND DEVICE INCORPORATING A TRANSFER PULSE SUPPLYING CIRCUIT FOR DRIVING A VERTICAL TRANSFER UNIT

CROSS-REFERENCE TO RELATED APPLICATIONS

The present application claims benefit of priorities of Japanese Patent Application No. 2007-114864 filed in the Japanese Patent Office on Apr. 24, 2007, the entire content of which is incorporated herein by reference.

BACKGROUND OF THE INVENTION

1. Field of the Invention

The present invention relates to a transfer pulse supplying circuit and a solid-state imaging apparatus. More particularly, the present invention relates to a transfer pulse supplying circuit that supplies vertical transfer pulses for use in driving a vertical transfer unit of a CCD (Charge Coupled Device) solid-state imaging apparatus, and a CCD solid-state imaging apparatus having the circuit.

2. Description of Related Art

In a CCD solid-state imaging apparatus, signal charge accumulated in each light-receiving element disposed in a light receiving portion is transferred to a vertical transfer unit, the signal charge transferred to the vertical transfer unit is transferred to a horizontal transfer unit, and the signal charge transferred to the horizontal transfer unit is transferred to an output circuit, thereby outputting the transferred signal charge. The output becomes image information. A period for one screen of a video device such as a display and a TV is referred to as "one frame", and for example, in an interlace method, two fields form one frame. Image information of the one field or one frame is repeatedly outputted, so that an image is viewed by the video device as a still picture or a moving picture.

In such a device, when the signal charge is transferred by the horizontal transfer unit, the horizontal transfer unit is driven in a state where the operation of the vertical transfer unit is ceased to extract signal charge information of one horizontal line (e.g., refer to FIG. 3 of Japanese Unexamined Patent Application Publication No. 2000-138943).

Once the signal charge information of one horizontal line is extracted for all the horizontal lines, pixel information of one frame is transferred basically.

More specifically, as in a timing chart shown in FIG. 3, the vertical transfer in the vertical transfer unit is performed in a horizontal blanking period (period denoted by reference sign "b" in the figure) when a horizontal transfer pulse denoted by reference sign "Hck" in the figure is kept in a certain level (high level in the timing chart shown in FIG. 3) so that switching noise of vertical transfer pulses denoted by reference sign "Vφ (Vφ1 to Vφ6)" does not affect the vertical transfer in an effect pixel period (period denoted by reference sign "a" in the figure).

That is, there occur potential fluctuations of a substrate in which the CCD solid-state imaging apparatus is formed at a timing of falling the vertical transfer pulses (reference signs "T2, T4, T6, T8, T10 and T12" in the figure) and a timing of rising the vertical transfer pulse rise (reference signs "T1, T3, T5, T7, T9 and T11" in the figure). Accordingly, the vertical transfer is performed in the horizontal blanking period to prevent such a potential fluctuation from affecting the output from the output circuit.

In recent years, with the CCD solid-state imaging apparatus, market needs for high image quality have advanced increase in number of pixels. There has also been a growing need for capturing a large number of images at the same time in a short time. It is therefore desired to provide a CCD type solid-state imaging device having a large number of pixels and the same degree of frame rate as currently used frame rate.

As methods for achieving the same degree of frame rate as currently used frame rate in a high-pixel CCD solid-state imaging apparatus, (1) a method of increasing a drive frequency at which the CCD solid-state imaging apparatus is driven, and (2) a method of performing the vertical transfer within the effective pixel period, are considered.

However, if the same degree of frame rate as currently used frame rate is tried to be achieved by increasing the drive frequency at which the CCD solid-state imaging apparatus is driven, an increase in heating value, increase in power consumption, increase in price of the substrate in which the CCD solid-state imaging apparatus is formed, increase in number of peripheral units, and the like, which are attributed to the increased drive frequency, are brought about. Thus, it is hard to say that the method of increasing the drive frequency at which the CCD solid-state imaging apparatus is driven to thereby achieve the same degree of frame rate as currently used frame rate is appropriate. Furthermore, the countermeasure of only the increase in the drive frequency to the recent demand for improving the frame rate has almost reached a limit.

On the other hand, if the same degree of frame rate as currently used frame rate is tried to be achieved by performing the vertical transfer within the effective pixel period, the effects of switching noise of the vertical transfer pulses are suffered, as described above. More specifically, at the rise timing of each of the vertical transfer pulses, and at the fall timing of each of the vertical transfer pulses, there occur potential fluctuations of the substrate in which the CCD solid-state imaging apparatus is formed, affecting the output from the output circuit, which causes fixed pattern noise (FPN).

More specifically, as in a timing chart shown in FIG. 4, when the vertical transfer is performed in the effective pixel period (period denoted by reference sign "a" in the figure), at T1 which is rise timing of the vertical transfer pulse denoted by reference sign Vφ6, T2 which is fall timing of the vertical transfer pulse denoted by reference sign Vφ2, T3 which is rise timing of the vertical transfer pulse denoted by reference sign Vφ1, T4 which is fall timing of the vertical transfer pulse denoted by reference sign Vφ3, T5 which is rise timing of the vertical transfer pulse denoted by reference sign Vφ2, T6 which is fall timing of the vertical transfer pulse denoted by reference sign Vφ4, T7 which is rise timing of the vertical transfer pulse denoted by reference sign Vφ3, T8 which is fall timing of the vertical transfer pulse denoted by reference sign Vφ5, T9 which is fall timing of the vertical transfer pulse denoted by reference sign Vφ4, T10 which is fall timing of the vertical transfer pulse denoted by reference sign Vφ6, T11 which is rise timing of the vertical transfer pulse denoted by reference sign Vφ5, and T12 which is fall timing of the vertical transfer pulse denoted by reference sign Vφ1, there occur potential fluctuations of the substrate in which the CCD solid-state imaging apparatus is formed, and these potential fluctuations cause FPN at the respective change times T1 to T12.

FPN of each horizontal line caused at the respective change times T1 to T12 is coupled longitudinally, which will appear as longitudinally linear image noise.

Considering noise at one point on a screen between frames or between fields with the same mechanism, since image noise occurs at the same position constantly between the frames or between the fields, the certain point on the screen is constantly noise (dark or light). The noise will be point-like noise staying on the screen independently of the occurrence of the longitudinal linear image noise.

Although these two are phenomena independent from each other, in the generating mechanism, FPN and the continuity (with the linear noise, the continuity in the vertical transfer period, and with the point-like noise, the continuity between the frames or between the fields) are the same, and thus, the linear noise will constantly appear on the screen if they occur simultaneously.

As means for solving the above-described problem, there is suggested a drive method in which the vertical transfer of the signal charge is performed in the horizontal effective scanning period, and during the vertical transfer, the vertical transfer unit is supplied a drive clock waveform of a rise and fall gradient with a transient speed $\Delta V/\Delta T$ at which crosstalk noise caused at the rise and fall of the drive clock waveform can be eliminated in a correlative double sampling circuit (e.g., refer to Japanese Unexamined Patent Application Publication No. 2005-269060 (hereinafter referred to as "Patent Document 2"). The drive method allows a high frame rate of the solid-state imaging apparatus to be realized.

However, since the employment of only the drive method described in Patent Document 2 does not suppress the crosstalk within the CCD solid-state imaging apparatus sufficiently, a method for further suppressing the crosstalk is employed in which when the vertical transfer is performed, instead of employing a sequential transfer method (refer to FIG. 5A), a vertical transfer method (complementary transfer method, refer to FIG. 5B) of changing the vertical transfer pulses in a reverse phase to each other simultaneously such that when one vertical transfer pulse becomes a high level, another vertical transfer pulse simultaneously becomes a low level is employed to cancel out the effects by the vertical transfer pulses.

SUMMARY OF THE INVENTION

With the vertical transfer pulses supplied to the vertical transfer unit, they are supplied to the vertical transfer unit by being applied to pad portions 101 as shown in FIG. 6. Since resistance values (R1, R2, R3 . . . ) and capacitance values (C1, C2, C3 . . . ) of respective wirings electrically connecting from the respective pad portions (supply sources of the vertical transfer pulses) to supply destinations of the respective vertical transfer pulses are different, it is difficult to achieve sufficient interpolation between the vertical transfer pulses, and thus, even if the complementary transfer method is employed, it is difficult to suppress the crosstalk sufficiently.

More specifically, as shown in FIG. 7, the respective vertical transfer pulses supplied to the pad portions 101 (101a, 101b) made of aluminum reach the vertical transfer unit through first aluminum wirings 102 (102a, 102b) disposed continuously to the pad portions and made of aluminum, tungsten wirings 103 (103a, 103b) connected to the first aluminum wirings and made of tungsten, and second aluminum wirings 104 (104a, 104b) connected to the tungsten wirings and made of aluminum. FIG. 7 shows a case where the vertical transfer pulse supplied to the pad portion denoted by reference sign 101a is supplied to the second aluminum wiring denoted by reference numeral 104a through the first aluminum wiring denoted by reference numeral 102a, and the tungsten wiring denoted by reference numeral 103a, while the vertical transfer pulse supplied to the pad portion denoted by reference numeral 101b is supplied to the second aluminum wiring denoted by reference numeral 104b through the first aluminum wiring denoted by reference numeral 102b, and the tungsten wiring denoted by reference numeral 103b.

Since length of the respective tungsten wirings are different, ratio of width to the length of the respective tungsten wirings (W/L) are different, and thus, the resistance values are different depending on the respective tungsten wirings. Moreover, since the respective tungsten wirings have different areas, capacitance values of the respective tungsten wirings are different. That is, since the resistance values and the capacitance values of the tungsten wirings are different from each other, the resistance values and the capacitance values of the respective wirings electrically connecting from the respective pads to the supply destinations of the respective vertical transfer pulses are different.

The present invention addresses the above-identified issues associated with the developing technologies. It is desirable to provide a transfer pulse supplying circuit and a solid-state imaging apparatus that uniformize the resistance value and the capacitance value of each of the wirings from the supply source of the transfer pulse to the supply destination of the transfer pulse, and eliminate the crosstalk noise sufficiently when the complementary transfer method is employed.

In accordance with an embodiment of the present invention, there is provided a transfer pulse supplying circuit for supplying transfer pulses to a solid-state imaging apparatus including a charge transfer unit which transfers signal charge stored in charge accumulating units by changing potential of the charge accumulating units, which includes N (N is an integer of two or more) transfer pulse supplying wirings to which the transfer pulses are supplied, and lead-in wirings connecting the transfer pulse supplying wirings to corresponding lead-out wirings from the charge transfer unit. The respective lead-in wirings have almost the same width and length as one another. At least part of the lead-in wirings is divided into a first region and second regions by slits, and the first region is connected to the transfer pulse supplying wiring and the lead-out wiring, the second region is connected to the lead-out wiring. Regions of the lead-in wirings connected to the transfer pulse supplying wirings have almost the same ratio of width to length as one another.

According to an embodiment of the present invention, the respective lead-in wirings have almost the same width and length as one another, so that the capacitances of the lead-in wirings are uniformized.

Moreover, with the regions of the respective lead-in wirings connected to the transfer pulse supplying wiring, that is, the lead-in wirings each divided into the first region and the second regions by slits, the ratios of the widths to the lengths of the first regions are almost the same, and with the lead-in wirings that are not each divided into the first region and the second regions by the slits, the ratios of the widths to the lengths of the entire regions of the lead-in wirings are almost the same. Thus, the resistance values of the regions of the lead-in wirings that are each connected to the transfer pulse supplying wiring are uniformized.

In accordance with an another embodiment of the present invention, there is provided a solid-state imaging apparatus includes light receiving portions arrayed in a matrix, a vertical transfer unit, disposed for each vertical column of the light receiving portions, for receiving signal charge transferred from the light receiving portions and transferring the transferred signal charge in a vertical direction, a horizontal transfer unit for receiving the signal charge transferred from the vertical transfer unit and transferring the transfer signal charge in a horizontal direction, and a vertical transfer pulse supplying circuit which supplies vertical transfer pulses for driving the vertical transfer unit to the vertical transfer unit. The vertical transfer pulse supplying circuit includes N (N is an integer of two or more) vertical transfer pulse supplying wirings to which the vertical transfer pulses are supplied, and lead-in wirings connecting the respective vertical transfer pulse supplying wirings to corresponding lead-out wirings from the vertical charge transfer unit. The respective lead-in wirings have almost the same width and length as one another. At least part of the lead-in wirings is divided into a first region and a second region by slits, and the first region is connected to the vertical transfer pulse supplying wiring and the lead-out wiring, the second region is connected to the lead-out wiring. Regions of the respective lead-in wirings connected to the vertical transfer pulse supplying wirings have almost the same ratio of width to length as one another.

According to another embodiment of the present invention, the respective lead-in wirings have almost the same width and length, so that the capacitances of the lead-in wirings are uniformized.

Moreover, with the regions of the lead-in wirings that are each connected to the vertical transfer pulse supplying wiring, that is, the lead-in wirings each divided into the first region and the second regions by slits, the ratios of the widths to the lengths of the first regions are almost the same, and with the lead-in wirings that are not each divided into the first region and the second regions by the slits, the ratios of the widths to the lengths of the entire regions of the lead-in wirings are almost the same, so that the resistance values of the regions of the lead-in wirings that are each connected to the vertical transfer pulse supplying wiring are uniformized.

In the above-described transfer pulse supplying circuit and the solid-state imaging apparatus having the circuit according to embodiments of the present invention, the resistance values and the capacitance values of the respective wirings from the supply sources of the transfer pulses to the supply destinations of the transfer pulses can be uniformized, so that when the complementary transfer method is employed, crosstalk noise can be eliminated sufficiently.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

FIG. 7 is a schematic diagram for explaining a known tungsten wirings.

DETAILED DESCRIPTION OF EMBODIMENTS

Figure 1:
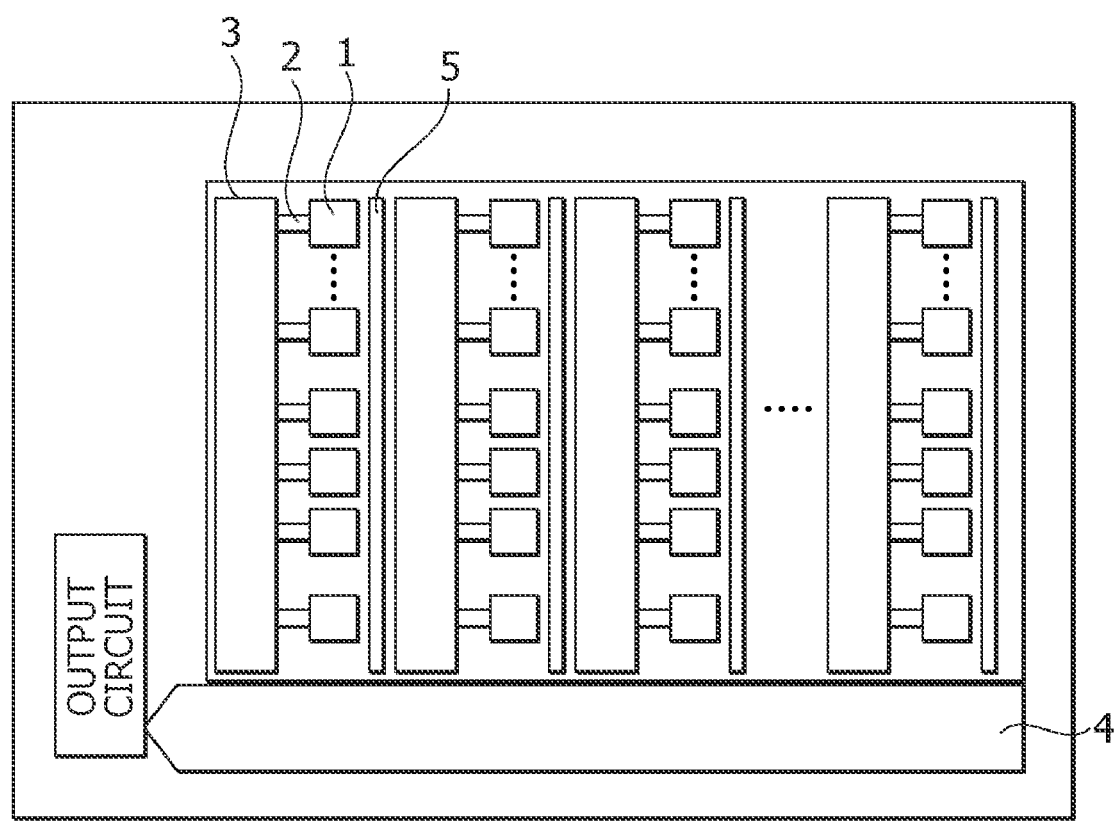
FIG. 1 is a schematic diagram for explaining a CCD solid-state imaging apparatus according to an embodiment of the present invention to which the present invention is applied.

Hereinafter, referring to the drawings, an embodiment of the present invention will be described to provide an understanding of the present invention.

FIG. 1 is a schematic diagram for explaining a CCD solid-state imaging apparatus as one example of a solid-state imaging apparatus to which an embodiment of the present invention is applied. The CCD solid-state imaging apparatus includes a plurality of light receiving portions 1 arrayed in a matrix, reading gates 2 that are each disposed adjacent to the light receiving portion and reading signal charge taken in by the light receiving portion, a vertical transfer unit 3 disposed adjacent to the reading gates and transferring the signal charge read by the reading gates in a vertical direction, a horizontal transfer unit 4 transferring the signal charge transferred by the vertical transfer unit in a horizontal direction, and a channel stop region 5 disposed on the counter side of the light receiving portions to the reading gates to suppress a mixed color.

Figure 6:
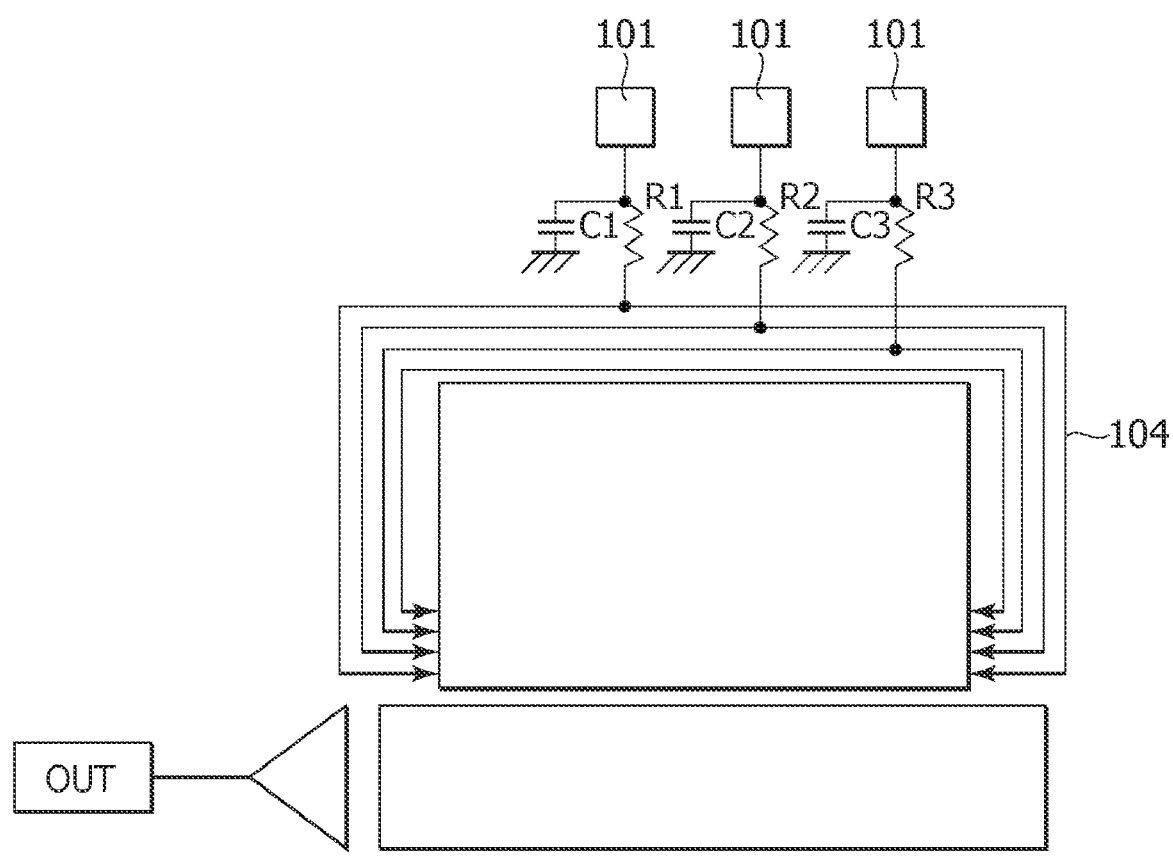
FIG. 6 is a schematic diagram for explaining supply routes of vertical transfer pulses.

The vertical transfer unit is supplied vertical transfer pulses to thereby transfer the signal charge in the vertical direction. With the vertical transfer pulses supplied to the vertical transfer unit, as in the known CCD solid-state imaging apparatus described above, by applying the vertical transfer pulses to the pad portions, they are supplied to the vertical transfer unit (refer to FIG. 6).

Figure 2:
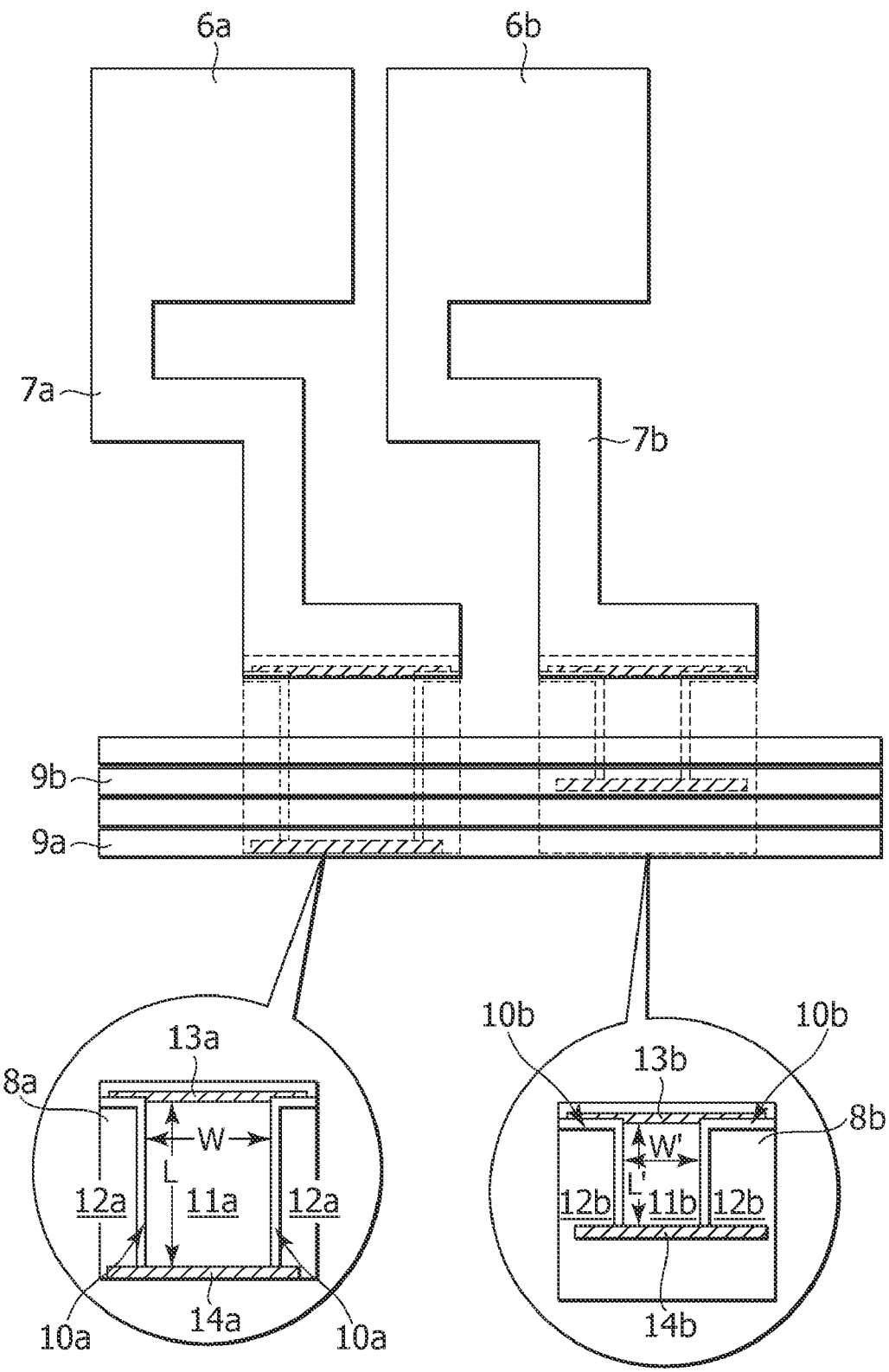
FIG. 2 is a schematic diagram for explaining tungsten wirings of the CCD solid-state imaging apparatus to which an embodiment of the present invention is applied.
Figure 3:
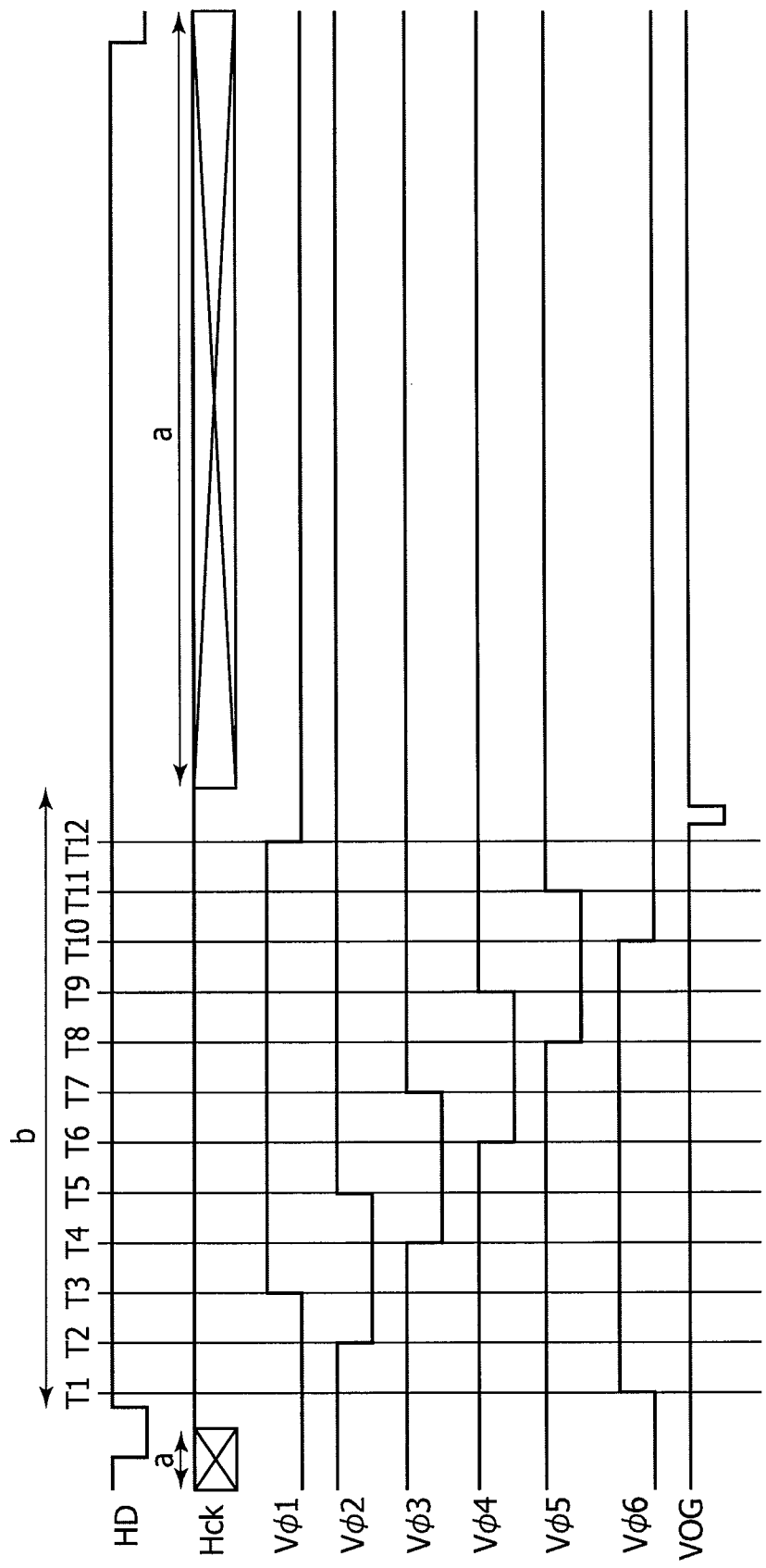
FIG. 3 shows one example of a timing chart of a drive method in which vertical transfer is not performed in an effective pixel period.
Figure 4:
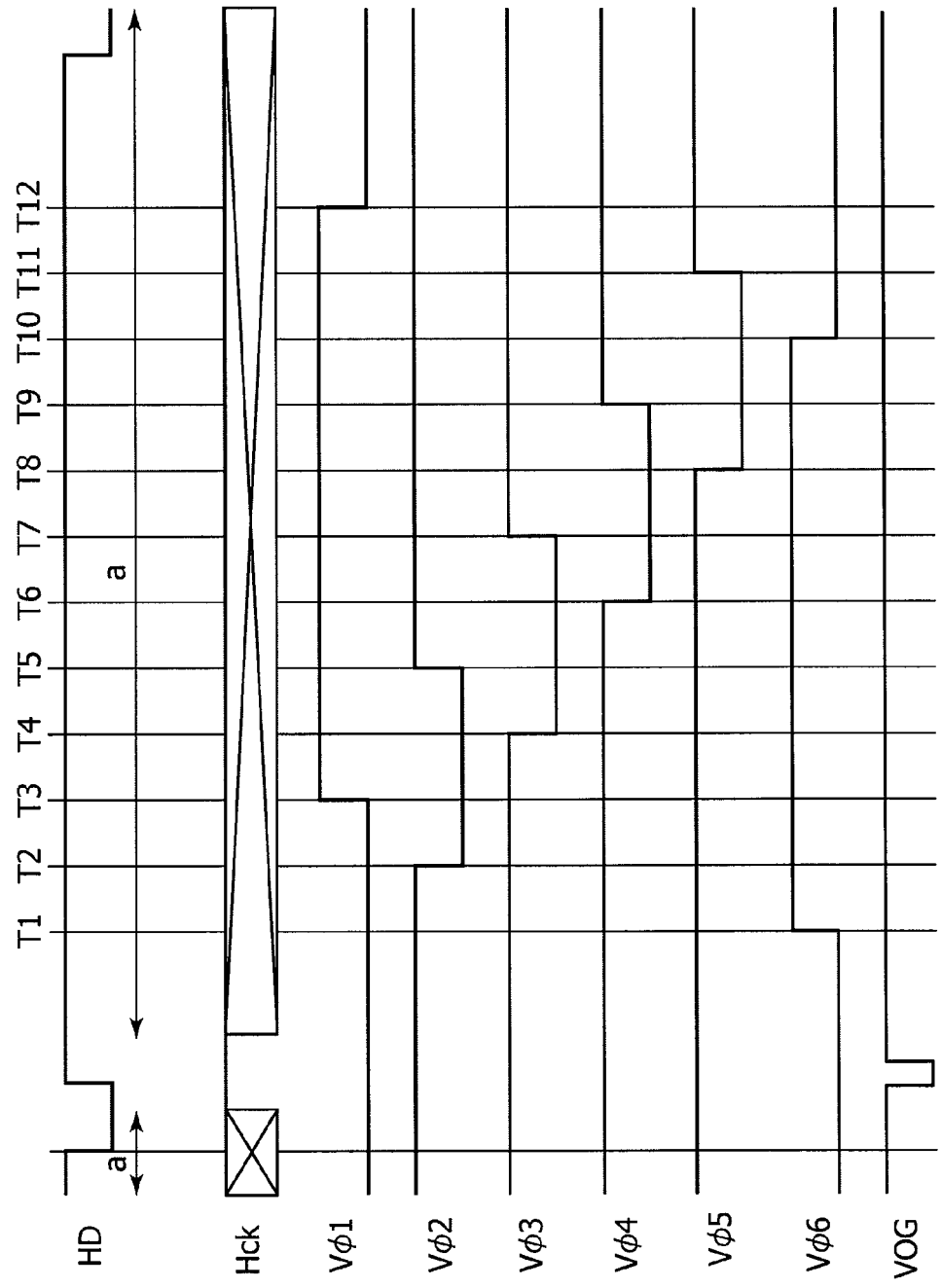
FIG. 4 shows one example of a timing chart of a drive method in which vertical transfer is performed in the effective pixel period.
Figure 5A:
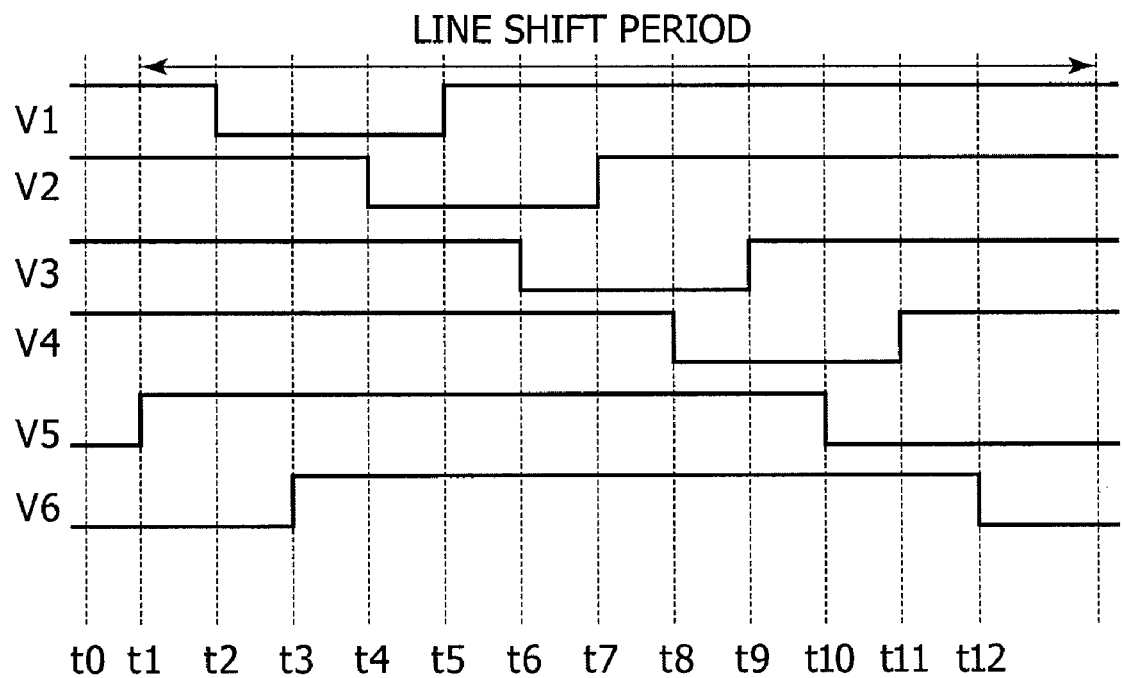
FIG. 5A is a timing chart for explaining a sequential transfer method.
Figure 5B:
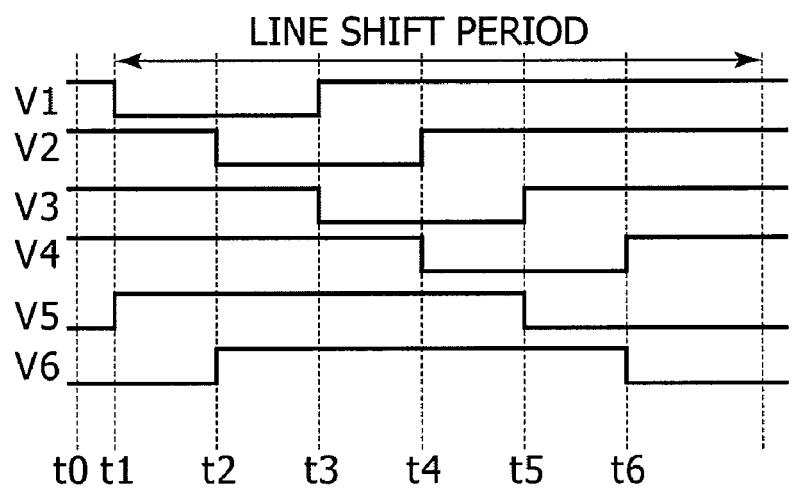
FIG. 5B is a timing chart for explaining a complementary transfer method.

More specifically, as shown in FIG. 2, the respective vertical transfer pulses supplied to pad portions 6 (6a, 6b) made of aluminum reach the vertical transfer unit through first aluminum wirings 7 (7a, 7b) disposed continuously to the pad portions and made of aluminum, tungsten wirings 8 (8a, 8b) connected to the first aluminum wirings and made of tungsten, second aluminum wirings 9 (9a, 9b) connected to the tungsten wirings and made of aluminum. FIG. 2 shows a case where the vertical transfer pulse supplied to the pad portion denoted by reference numeral 6a (hereinafter, referred to as "pad portion A" for convenience of explanation) is supplied to the second aluminum wiring denoted by reference numeral 9a (hereinafter, referred to as "second aluminum wiring A" for convenience of explanation) through the first aluminum wiring denoted by reference numeral 7a (hereinafter, referred to as "first aluminum wiring A" for convenience of explanation), and the tungsten wiring denoted by reference numeral 8a (hereinafter, referred to as "tungsten wiring A" for convenience of explanation), while the vertical transfer pulse supplied to the pad portion denoted by reference numeral 6b (hereinafter, referred to as "pad portion B" for convenience of explanation) is supplied to the second aluminum wiring denoted by reference numeral 9b (hereinafter, referred to as "second aluminum wiring B" for convenience of explanation) through the first aluminum wiring denoted by reference numeral 7b (hereinafter, referred to as "first aluminum wiring B" for convenience of explanation), and the tungsten wiring denoted by reference numeral 8b (hereinafter, referred to as "tungsten wiring B" for convenience of explanation).

The first aluminum wiring is one example of a transfer pulse supplying wiring and a vertical transfer pulse supplying wiring, the tungsten wiring is one example of a lead-in wiring, and the second aluminum wiring is one example of a lead-out wiring.

The respective tungsten wirings are formed such that the widths and the lengths thereof are almost the same, that is, the widths and the lengths of the tungsten wiring A and the tungsten wiring B are almost the same, so that the tungsten wiring A and the tungsten wiring B overlap all the second aluminum wirings. More specifically, with the tungsten wiring B, the tungsten wiring is formed even in a region beyond a connection position with the second aluminum wiring (fourth via described later).

Since the widths and the lengths of the respective tungsten wirings are almost the same, the areas of the respective tungsten wirings are almost the same.

Moreover, the respective tungsten wirings are each disposed with slits to be divided into a first region and second regions. More specifically, the tungsten wiring A is divided into a first region (A) 11a and second regions (A) 12a by providing slits A 10a, and the tungsten wiring B is divided into a first region (B) 11b and second regions (B) 12b by providing slits B 10b, so that a ratio (W/L) of a width (distance denoted by reference sign W in the figure) to a length (distance denoted by reference sign L in the figure) of the first region (A) of the tungsten wiring A and a ratio (W'/L') of a width (distance denoted by reference sign W' in the figure) to a length (distance denoted by reference sign L' in the figure) of the first region (B) of the tungsten wiring B are equal or almost equal.

Furthermore, the first region (A) of the tungsten wiring A is connected to the first aluminum wiring A through a first via 13a, and connected to the second aluminum wiring A through a second via 14a, and the second regions (A) of the tungsten wiring A are connected to the second aluminum wiring A through the second via 14a. Similarly, the first region (B) of the tungsten wiring B is connected to the first aluminum wiring B through a third via 13b, and connected to the second aluminum wiring B through a fourth via 14b, and the second regions (B) of the tungsten wiring B are connected to the second aluminum wiring B through the fourth via 14b.

Although the slits are formed in both the tungsten wiring A and the tungsten wiring B so as to divide the respective tungsten wirings into the first regions and the second regions, in an embodiment of the present invention, equal or almost equal widths and lengths of the respective tungsten wirings and the same or almost same ratios of the widths to the lengths of the regions connected to the first aluminum wirings and the second aluminum wirings suffice, and not all the tungsten wirings need to be divided into the first regions and the second regions. For example, when each of the tungsten wiring is formed so that the first region of the tungsten wiring A shown in FIG. 2 has an overall size of the wiring, the slits do not need to be formed in the tungsten wiring A, and the slits are formed in only the tungsten wiring B.

In the CCD solid-state imaging apparatus to which an embodiment of the present invention is applied, since the widths and the length of the tungsten wirings are the same and both the first region and the second regions are connected to the second aluminum wirings, the capacitance values of the respective tungsten wirings are uniformized.

Since the device is configured such that the ratio of the width to the length of the respective first regions of the tungsten wirings connecting to the first aluminum wirings and the respective second aluminum wirings are equal or almost equal, the resistance values of the respective first regions are uniformized. Such a configuration equalizes the resistance value and the capacitance value of a path (wiring) for the vertical transfer pulse supplied to the pad A to reach the second aluminum wiring A and the resistance value and the capacitance value of a path (wiring) for the vertical transfer pulse supplied to the pad B to reach the second aluminum wiring B. As a result, the resistance values and the capacitance values of the respective wirings from the pad portions as the supply sources of the vertical transfer pulses to the supply destinations of the vertical transfer pulses can be uniformized.

In an embodiment of the present invention, in order to uniformize the resistance values and the capacitance values of the tungsten wirings, the limit for the lengths and the widths of the tungsten wirings are imposed, but any limit for the first aluminum wirings and the second aluminum wirings are not imposed. However, as compared with the tungsten wirings, the aluminum wirings have extremely low resistance, and thus, the effects by the resistance values on the vertical transfer pulses are considered to be very small. Accordingly, it can be considered that by uniformizing the resistance values and the capacitance values of the tungsten wirings, the resistance values and the capacitance values of the respective wirings from the pad portions as the supply sources of the vertical transfer pulses to the supply destinations of the vertical transfer pulses can be uniformized.

Moreover, as described above, since the resistance values and the capacitance values of the respective wirings from the pad portions as the supply sources of the vertical transfer pulses to the supply destinations of the vertical transfer pulses can be uniformized, the employment of the complementary transfer method allows the crosstalk noise to be eliminated sufficiently. Furthermore, even if the vertical transfer of the signal charge is performed in the horizontal effective scanning period, the effects on the output signal due to crosstalk noise can be suppressed sufficiently, which leads to the realization of a high frame rate.

It should be understood by those skilled in the art that various modifications, combinations, sub-combinations and alternations may occur depending on design requirements and other factors insofar as they are within the scope of the appended claims or equivalents thereof.

What is claimed is:

1. A transfer pulse supplying circuit for supplying transfer pulses to a solid-state imaging apparatus including a charge transfer unit which transfers signal charge stored in charge accumulating units by changing potential of the charge accumulating units, the transfer pulse supplying circuit comprising:
    N (N is an integer of two or more) transfer pulse supplying wirings to which the transfer pulses are supplied; and
    lead-in wirings connecting the transfer pulse supplying wirings to corresponding lead-out wirings from the charge transfer unit,
    wherein
        the respective lead-in wirings all have substantially the same width and length,
        the lead-in wirings include a first region and a second region separated by slits, the first region is connected to the transfer pulse supplying wirings and the lead-out wiring, and the second region is connected to the lead-out wiring, and
        regions of the respective lead-in wirings connected to the transfer pulse supplying wirings all have substantially the same ratio of width to length.

2. The transfer pulse supplying circuit according to claim 1, wherein the transfer pulse supplying wirings and the lead-out wirings each are formed of a material having a lower resistance value than that of the lead-in wirings.

3. The transfer pulse supplying circuit according to claim 1, wherein each of the first region and the second region of the lead-in wirings has an extending portion extending to an opposite side of the transfer pulse supplying wiring beyond a connecting portion connecting the lead-in wiring and the lead-out wiring.

4. A solid-state imaging apparatus comprising:

light receiving portions arrayed in a matrix;

a vertical transfer unit connected to each vertical column of the light receiving portions for receiving signal charge transferred from the light receiving portions and transferring the transferred signal charge in a vertical direction;

a horizontal transfer unit for receiving the signal charge transferred from the vertical transfer unit and transferring the transfer signal charge in a horizontal direction; and a vertical transfer pulse supplying circuit which supplies vertical transfer pulses for driving the vertical transfer unit to the vertical transfer unit, the vertical transfer pulse supplying circuit including:

N (N is an integer of two or more) vertical transfer pulse supplying wirings to which the vertical transfer pulses are supplied; and lead-in wirings connecting the respective vertical transfer pulse supplying wirings to corresponding lead-out wirings from the vertical charge transfer unit, wherein, the respective lead-in wirings all have substantially the same width and length, the lead-in wirings include a first region and a second region separated by slits, the first region is connected to the vertical transfer pulse supplying wiring and the lead-out wiring, and the second region is connected to the lead-out wiring, and regions of the respective lead-in wirings connected to the vertical transfer pulse supplying wirings all have substantially the same ratio of width to length.

5. The solid-state imaging apparatus according to claim 4, wherein the vertical transfer pulse supplying wirings and the lead-out wirings each are formed of a material having a lower resistance value than that of the lead-in wirings.

6. The solid-state imaging apparatus according to claim 4, wherein each of the first region and the second region of the lead-in wirings has an extending portion extending to an opposite side of the vertical transfer pulse supplying wiring beyond a connecting portion connecting the lead-in wiring and the lead-out wiring.

7. The solid-state imaging apparatus according to claim 4, wherein the signal charge is transferred by the vertical transfer unit during transferring the signal charge by the horizontal transfer unit.

* * * * *